United States Patent [19]

Nakamura

[11] Patent Number: 4,920,641
[45] Date of Patent: May 1, 1990

[54] METHOD OF MANUFACTURING AN ELECTRONIC PART

[75] Inventor: Takeshi Nakamura, Nagaokakyo, Japan

[73] Assignee: Murata Manufacturing Co., Ltd., Nagaokakyo, Japan

[21] Appl. No.: 267,735

[22] Filed: Nov. 2, 1988

Related U.S. Application Data

[62] Division of Ser. No. 62,975, Jun. 17, 1987, abandoned.

[30] Foreign Application Priority Data

Jun. 19, 1986 [JP] Japan .................................. 61-143776

[51] Int. Cl.[5] ...................... H01L 41/22; H01R 43/00
[52] U.S. Cl. ...................... 29/856; 29/25.35; 29/25.42; 29/414
[58] Field of Search ............... 29/856, 841, 827, 25.35, 29/25.42, 413, 414; 310/320, 321, 323, 340–344, 348

[56] References Cited

U.S. PATENT DOCUMENTS

| | | | |
|---|---|---|---|
| 3,913,195 | 10/1975 | Beaver | 29/25.35 |
| 3,952,387 | 4/1976 | Iinuma et al. | 29/25.35 |
| 4,649,460 | 3/1987 | Mavchisi et al. | 29/827 X |
| 4,720,916 | 1/1988 | Ventura | 29/856 |

Primary Examiner—Carl E. Hall
Attorney, Agent, or Firm—Armstrong, Nikaido, Marmelstein, Kubovcik & Murray

[57] ABSTRACT

An electronic part comprises an electronic element, for example, a piezo-electric vibrator. This electronic element has a first connecting electrode on one of the main surfaces thereof and has a second connecting electrode on the other main surface thereof. A first external electrode is connected to this first connecting electrode. Furthermore a second external electrode is connected to the second connecting electrode. The first external electrode and the second external electrode are fixed by fixing member composed of an insulating material at the peripheral edge parts thereof. Thereby, the electronic element is covered with the first connecting electrode, the second connecting electrode and the fixing member.

2 Claims, 3 Drawing Sheets

METHOD OF MANUFACTURING AN ELECTRONIC PART

This application is a division of application Ser. No. 062,975 filed June 17, 1987.

BACKGROUND OF THE INVENTION

1. Field of the Invention

The present invention relates to an electronic part and a manufacturing method thereof. More specifically, the present invention relates to an electronic part which comprises a plate-shaped electronic element having connecting electrodes protected from exterior on both main surfaces thereof and a manufacturing method thereof.

2. Description of the Prior Art

The conventional vibrator support structure which is the background of the present invention is disclosed, for example, in U.S. Pat. No. 4,511,821.

The vibrator support structure discloses in this U.S. patent has connecting terminal members extending to the outside of a casing. For this reason, in order to mount the vibrator support structure, for example, on a printed circuit board, the connecting terminal members have to be inserted into holes of the printed circuit board, and the work of mounting it is very troublesome. Also, in this case, a space for the connecting terminal members is required, and therefore a large space for mounting the vibrator support structure is required.

SUMMARY OF THE INVENTION

Therefore, the principal object of the present invention is to provide an electronic part wherein connecting terminal members extending outside are not formed.

Another object of the present invention is to provide a method of manufacturing an electronic part capable of efficiently manufacturing such a novel electronic part.

An electronic part in accordance with the present invention comprises a plate-shaped electronic element having connecting electrodes on the both main surfaces thereof, a first external electrode which is formed on one of the main surfaces of this electronic element and is connected to one of the connecting electrodes, a second external electrode which is formed on the other main surface of the electronic element and is connected to the other connecting electrode, and a fixing member composed of an insulating material which is formed on the surfaces of the peripheral edge parts of the first external electrode and the second external electrode and the end part of the electronic element to fix the first external electrode and the second external electrode in a state of contact respectively with one and the other connecting electrodes, and the electronic element is covered with the first external electrode, the second external electrode and the fixing member.

A method of manufacturing an electronic part in accordance with the present invention comprises a step of preparing a plurality of plate-shaped electronic elements which are connected respectively with intervals maintained in the direction parallel with the main surfaces thereof and have connecting electrodes on the both main surfaces thereof respectively, a step of preparing a plurality of first external electrodes which are connected respectively with intervals maintained therebetween so as to face a plurality of electronic elements and are to be connected respectively to one of each pair of plural connecting electrodes, a step of preparing a plurality of second external electrodes which are connected respectively with intervals kept maintained therebetween so as to face a plurality of electronic elements and are to be connected to the other of each pair of plural connecting electrodes, a step of positioning a plurality of first external electrodes and a plurality of second external electrodes so as to make simultaneous contacts respectively with one and the other of each pair of plural connecting electrodes, a step of simultaneously forming fixing member composed of an insulating material on the surfaces of the peripheral edge parts of a plurality of first external electrodes and a plurality of second external electrodes and the end parts of a plurality of electronic elements to fix the the first external electrodes and the second external electrodes in a state of contact respectively with one and the other of each pair of connecting electrodes and cover the electronic elements in cooperation with the first external electrodes and the second external electrodes, and a step of forming a plurality of chips by cutting the fixing members between the electronic elements so that each chip comprises the electronic element, the first external electrode and the second external electrode corresponding thereto.

In an electronic part in accordance with the present invention, the first external electrode, the second external electrode and the fixing member are formed so as to cover the electronic element, and therefore the first external electrode, the second external electrode and the fixing member work, for example, as an armoring member or an armoring case for protecting the electronic element from exterior. The first external electrode and the second external electrode are connected respectively to one and the other of the connecting electrodes of the electronic element, and the central parts of the first and the second external electrodes are put in an exposed state.

Accordingly, in accordance with the present invention, the exposed central parts of the first external electrode and the second external electrode can be used as external electrodes, and therefore an electronic part is obtained wherein no connecting terminal members extending outside are formed.

For this electronic part, for example, a conductive paste or a bonding wire is used to mount it, for example, on a printed circuit board, and therefore the labor for inserting terminals through holes of the printed board can be saved and the mounting can be simplified. Also, in this case, the mounting of this electronic part using a conductive paste can reduce the space for mounting.

Furthermore, this electronic part can be formed thinner because no terminals extending outside are formed. Accordingly, this electronic part can be employed as a part, for example, for an IC card having only a thin (narrow) housing space.

Also, in the method in accordance with the present invention, the first external electrode and the second external electrode are positioned simultaneously, and further the fixing member is formed simultaneously on these electrodes.

Accordingly, in accordance with the present invention, a novel electronic part can be manufactured efficiently.

These objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 1A is a perspective view thereof, and FIG. 1B is a cross-sectional view taken along line 1B—1B in FIG. 1A.

DESCRIPTION OF THE PREFERRED EMBODIMENTS

Figure 1A:
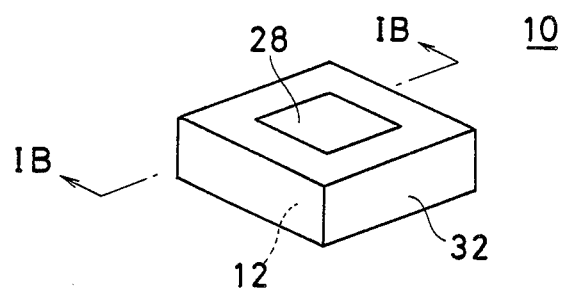
FIG. 1A and FIG. 1B show one embodiment in accordance with the present invention respectively.
Figure 1B:
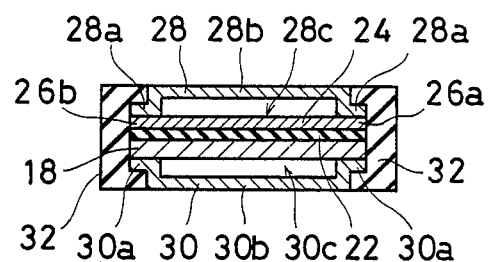

FIG. 1A and FIG. 1B respectively show an embodiment in accordance with the present invention, and FIG. 1A is a perspective view thereof, and FIG. 1B is a cross-sectional view taken along line 1B—1B in FIG. 1A. In this embodiment, description of made particularly on one example of a piezoelectric vibrator as an electronic part, but it is pointed out in advance that the present invention is applicable also to other electronic parts, for example, a capacitor and a CR composite element wherein a plate-shaped electronic element, having connecting electrodes on the both surfaces thereof, is protected from exterior.

Figure 2:
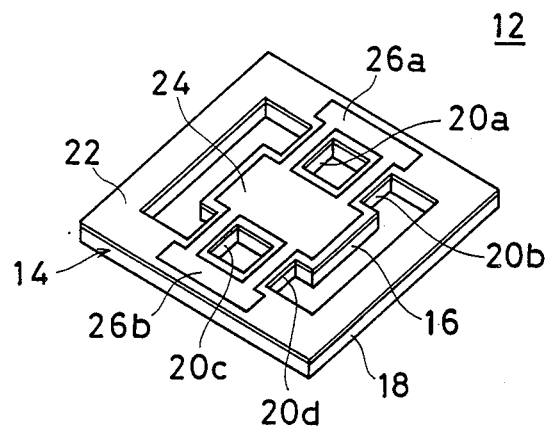
FIG. 2 is a perspective view showing one example of a vibrator element employed in the embodiment as shown in FIG. 1A and FIG. 1B.

This piezo-electric vibrator 10 comprises a rectangular-plate-shaped vibrator element 12 in an electronic element as shown in FIG. 2. This vibrator element 12 comprises a substrate 14 composed of a constant-elasticity metallic material (a metallic material which easily generates mechanical vibration). For such a constant-elasticity metallic material, for example, elinvar, invar coelinvar, 42 Ni alloy or 36 Ni alloy (invar) can be utilized. The substrate 14 is formed so as to comprise a square-islandshaped vibrator part 16 and a support frame 18 surrounding it. In this case, this vibrator part 16 is connected to support frame 18 at two opposing side portions by connecting parts 20a, 20b, 20c and 20d. In addition, this support frame 18 is used as a connecting electrode.

Furthermore, a piezo-electric film 22 is formed on one of each pair of the main surfaces (top surfaces) of the vibrator part 16, the support frame 18 and the connecting parts 20a–20d. For a material of this piezo-electric film 22, for example, zinc oxide (ZnO) or aluminum nitride (AlN) can be utilized.

Also, an electrode 24 is formed on the surface of the piezo-electric film 22. In this case, the electrode 24 is led out to two side portions of the support frame 18 through the connecting parts 20a–20d and is connected to two lead-out electrodes 26a and 26b. In addition, these lead-out electrodes 26a and 26b are used as connecting electrodes. For material of these electrodes 24, 26a and 26b, for example, nickel, aluminum, silver or gold can be utilized.

Furthermore, as shown in FIG. 1B, in the vibrator element 12, a first external electrode 28 is formed on one of the main surfaces thereof and a second external electrode 30 is formed on the other main surface thereof.

This first external electrode 28 has nearly the same plane size as that of the vibrator element 12 and is formed in a brim-shape so that the peripheral edge portion 28a thereof faces the piezo-electric film 22 and the lead-out electrodes 26a and 26b on the support frame 18. Furthermore, the central portion 28b of the first external electrode 28 is depressed upward, and thereby a concave part 28c is formed at the central part of the first external electrode 28. Then, the first external electrode 28 is disposed so that the peripheral edge portion 28a thereof contacts the lead-out electrodes 26a and 26b on one of the main surfaces of the vibrator element 12.

On the other hand, as with the first external electrode 28, the second external electrode 30 has nearly the same plane size as that of the vibrator element 12 and is formed in a brim shape so that the peripheral edge portion 30a thereof faces the support frame 18. Furthermore, the central portion 30b of the second external electrode 30 is depressed downward in an opposite direction as the case of the first external electrode 28, and thereby a concave part 30c is formed also at the central part of the second external electrode 30. Then, the second external electrode 30 is disposed so that the peripheral edge portion 30a thereof contacts the support frame 18 on the other main surface of the vibrator element 12.

In this case, the space defined by the concave parts 28c and 30c of the external electrodes 28 and 30 becomes a vibration space for vibrating the vibrator element 12.

Furthermore, fixing member 32 composed of an insulating material, for example, resin such as epoxy resin or glass is formed on the surface of the peripheral edge portions 28a and 30a of these external electrodes 28 and 30 and the end part of the vibrator element 12. The external electrodes 28 and 30 are fixed to the vibrator element 12 by this fixing member 32.

Accordingly, the first external electrode 28 and the second external electrode 30 are connected electrically to the connecting electrodes 26a and 26b and the support frame 18, respectively. Also, the central portions of the first external electrode 28 and the second external electrode 30 are exposed, and thus these portions can be used as external electrodes.

Furthermore, this vibrator element 12 is covered with these external electrodes 28 and 30 and the fixing member 32 and is sealed from outside. In addition, for a material of these external electrodes 28 and 30, a metallic material having a small thermal expansion coefficient, for example, 42 Ni alloy or Kovar is preferable. Also, for a material of the fixing member 32, an insulating material having a thermal expansion coefficient close to that of the external electrodes 28 and 30 is preferable. Thus, by forming the external electrodes 28 and 30 with a metallic material having a small thermal expansion coefficient and forming the fixing member 32 with an insulating material having a thermal expansion coefficient close to that of the external electrodes 28 and 30, a state in which the vibrator element 12 is sealed by the external electrodes 28 and 30 and the fixing member 32 can be maintained, for example, even when the ambient temperature is varied.

This piezo-electric vibrator 10 uses the exposed plane portions of the first external electrode 28 and the second external electrode 30 as external electrodes, therefore the piezo-electric vibrator 10 has no terminals extending outside. Then, to mount this piezo-electric vibrator 10, for example, on a printed circuit board, the exposed portion of the external electrodes 28 and 30 have only to be connected to the connecting portions of the printed circuit board, for example, using a conductive paste or a bonding wire.

Next, description is made on one example of a method of manufacturing a piezo-electric vibrator 10 as shown in FIG. 1A and FIG. 1B in reference to FIG. 3A through FIG. 3C and FIG. 4.

Figure 3A:
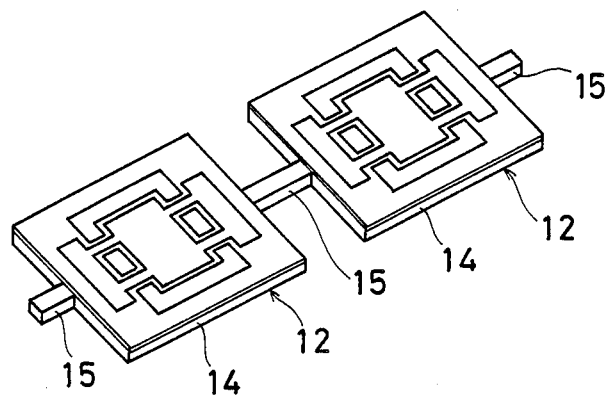
FIG. 3A is a perspective view showing a plurality of vibrator elements connected to each other.

First, as shown in FIG. 3A, a plurality of vibrator elements 12 are prepared which are connected respectively by joints 15 with intervals kept in one direction on the same plane.

A plurality of vibrator elements 12 connected in such a manner comprises a plurality of substrates 14 connected by the joints 15. These plural substrates 14 and joints 15 are formed, for example, by press-forming or etching a belt-shaped metallic material having constant elasticity. In this case, each substrate 14 is formed in a manner that only the central end parts thereof are connected by the narrow joints 15. The reason why the joint 15 is formed in a narrow shape as described above is to allow the insulating material which comprises the fixing member 32, to extend around the connected portion of the vibrator element 12 and the joint 15. Also, as shown particularly in FIG. 2, each substrate 14 is formed in a manner that the vibrator portion 16 is connected to the support frame 18 by the connecting parts 20a–20d.

Furthermore, on the surfaces of these substrates 14, the piezo-electric films 22 composed, for example, of zinc oxide or aluminum nitride are formed, for example, by sputtering.

Furthermore, on the surface of the piezo-electric film 22 on the vibrator portion 16 and the connecting parts 20a–20d of each substrate 14 as shown particularly in FIG. 2, the electrode 24 is formed. Also, on the surfaces of the piezo-electric films 22 on two side portions of the support frame 18, the lead-out electrodes 26a and 26b are formed so as to be connected to the electrode 24. These lead-out electrodes 26a and 26b and electrode 24 are formed by evaporating a conductive material, for example, nickel, aluminum, silver or gold onto the surface of the piezo-electric film 22.

Figure 3B:
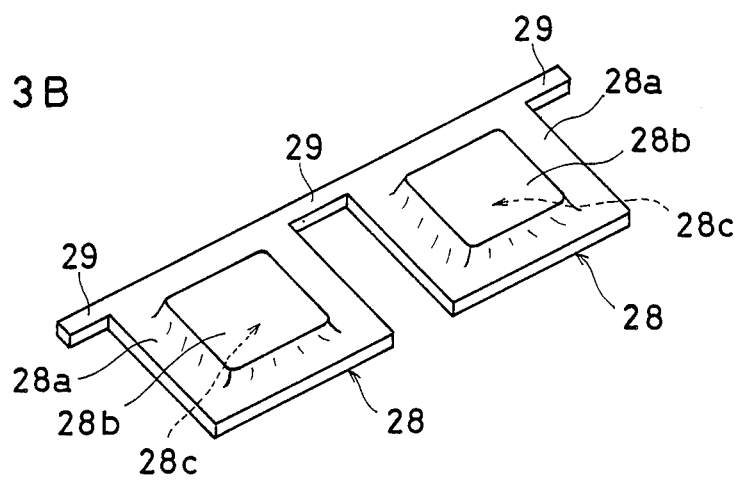
FIG. 3B is a perspective view showing a plurality of first external electrodes connected to each other.

Also, as shown in FIG. 3B, a plurality of first external electrodes 28 are prepared which are connected respectively by joints 29 with intervals maintained in one direction on the same plane. These first external electrodes 28 are formed so as to face a plurality of vibrator elements 12 connected to each other, respectively. A plurality of first external electrodes 28 connected to each other are formed, for example, by press-forming a belt-shaped metallic material, for example, 42 Ni alloy or Kovar. In this case, each first external electrode 28 is formed so as to be connected by narrow joints 29, and each peripheral edge portion 28a thereof is formed in a brim shape, and each central portion 28b thereof is formed so as to be depressed upward.

Figure 3C:
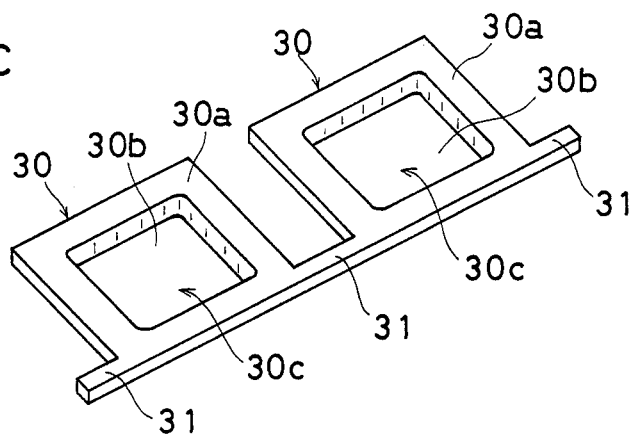
FIG. 3C is a perspective view showing a plurality of second external electrodes connected to each other.

Furthermore, as shown in FIG. 3C, a plurality of second external electrodes 30 are prepared which are connected respectively by joints 31 with intervals maintained in one direction on the same plane. These second external electrodes 30 are formed so as to face a plurality of vibrator elements 12 connected to each other respectively. A plurality of second external electrodes 30 have a structure similar to an inverse of the above-described plural first external electrodes 28 connected to each other, and are formed, for example, by press-forming a metallic material, for example, 42 Ni alloy or Kovar. This means that each second external electrode 30 is formed so as to be connected by narrow joints 31, and each peripheral edge portion 30a thereof is formed in a brim shape.

Figure 4:
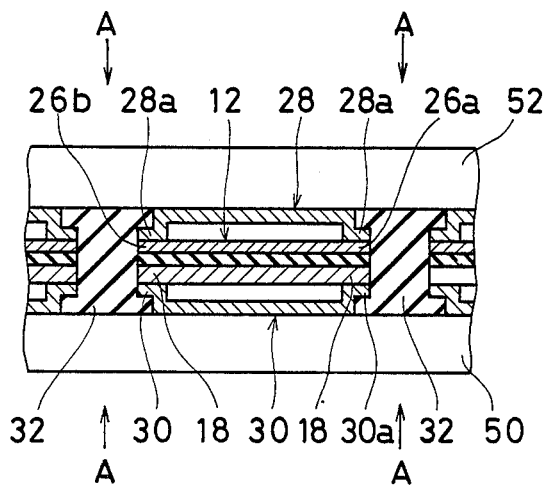
FIG. 4 is an illustrative view showing processes of manufacturing the electronic part as shown in FIG. 1A and FIG. 1B.

Then, as shown in FIG. 4, a plurality of first external electrodes 28, second external electrodes 30 and vibrator elements 12 are stacked in sequence on a lower metal mold 50. In this case, the first external electrode 28 is brought in contact with one of the main surfaces of the vibrator element 12, and the second external electrode 30 is brought in contact with the other main surface of the vibrator element 12. Furthermore, in this case, each of the joints 15, 29 and 31 is disposed at a shafted position to prevent a short-circuit between them.

Furthermore, the first external electrode 28 and the like are pressed from above by an upper metal mold 52. In this case, a plurality of vibrator elements 12, first external electrodes 28 and second external electrodes 30 are positioned simultaneously.

Then, the space defined by a plurality of vibrator elements 12, first external electrodes 28 and second external electrodes 30, the lower metal mold 50 and the upper metal mold 52 is filled with an insulating material, for example, resin or glass, and thereafter the insulating material is cured, and thereby the fixing members 32 are formed. In this case, since the vibrator elements 12, the first external electrodes 28 and the second external electrodes 30 are arranged in large numbers, large numbers of fixing members 32 can be formed at one time. In addition, the fixing members 32 are formed also around the joints 15, 29 and 31.

Then, for example, as shown by arrows A—A in FIG. 4, the piezo-electric vibrators 10 (chips) are formed by cutting the fixing member 32 and the joints 15, 29 and 31 between the respective vibrator elements 12.

In addition, in the above-described manufacturing method, a plurality of vibrator elements 12 connected to each other in one direction are prepared to form the piezo-electric vibrators 10, but in accordance with the present invention, a plurality of vibrator elements 12 and the like which are connected in a matrix pattern may be prepared to form the piezo-electric vibrators 10.

Figure 5:
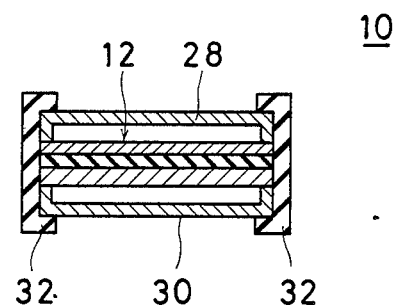
FIG. 5 is a cross-sectional view showing another embodiment in accordance with the present invention.

FIG. 5 is a cross-sectional view showing another embodiment in accordance with the present invention. In this piezo-electric vibrator 10, particularly the first external electrode 28 and the second external electrode 30 are formed so as to have a U-shaped cross-section. Thus, the shapes of the external electrodes 28 and 30 may be changed arbitrarily.

In addition, in the above-described respective embodiments, a rectangular-plate-shaped electronic element is used, but in the present invention, an electronic element of another shape, for example, a disc shape can be also used.

Also, in the above-described respective embodiments, the external electrodes are exposed from the top surface and the bottom surface of the electronic part, but it is possible that a separate external electrode is formed on the surface of the fixing member and the external electrode is led out to the side surface of the electronic part. Such a separate external electrode can be formed, for example, by coating silver paste on the surface of the fixing member. Also, if it is not required to be thin, for example, a ribbon-shaped or a round-rodshaped external terminal may be attached to the exposed portion of the external electrode.

Also, in the above-described respective embodiment, since the piezo-electric vibrator element is used as one example of the electronic element, the concave part to be a vibration space is formed at the central portion of the external electrode, but when the present invention is applied to an electronic part requiring no vibration space, for example, a capacitor, no concave part is required to be formed in the external electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a plurality of electronic parts, comprising the steps of:

preparing a plurality of plate-shaped electronic elements spaced apart in a direction parallel with main surfaces of said plate-shaped electronic elements and interconnected with one another by interconnecting joints which maintain a fixed spacing between adjacent elements, each plate-shaped electronic element having connecting electrodes on both surfaces thereof;

preparing a plurality of first external electrodes spaced apart and in corresponding relationship with said spaced apart electronic elements, said plurality of first external electrodes being interconnected by interconnecting joints and each having a size large enough to substantially cover a surface of said electronic element;

preparing a plurality of second external electrodes spaced apart and in corresponding relationship said spaced apart electronic elements, said plurality of second external electrodes being interconnected by interconnecting joints and each having a size large enough to substantially cover a surface of said electronic element;

substantially simultaneously positioning said plurality of first external electrodes and said plurality of second external electrodes to contact said connecting electrodes of said corresponding plate-shaped electronic elements, respectively;

substantially simultaneously providing an insulating material in the spaces between adjacent electronic elements and on the surfaces of peripheral portions of said plurality of first external electrodes and said plurality of second external electrodes and edge portions of said plurality of electronic elements, such that said first and second external electrodes are respectively clamped onto, and in electrical contact with, respective connecting electrodes of each of said plate-shaped electronic elements so that said first and second external electrodes and said insulating material completely cover said electronic elements; and separating said plurality of electronic elements and first and second external electrodes into individual electronic parts, each having a first and second external electrode, by cutting said insulating material between adjacent electronic elements and severing the interconnecting joints of the plurality of electronic elements, the plurality of first external electrodes, and the plurality of second external electrodes, said insulating material forming a fixing member for each electronic part.

2. The method of claim 1, wherein said simultaneous positioning step includes holding said plurality of electronic elements and said plurality of second external electrodes between two metal molds, and said simultaneous insulating material forming step includes forming said insulating material in spaces defined by said plurality of first external electrodes, said plurality of electronic elements, said plurality of second external electrodes and said two metal molds.

* * * * *